(12) United States Patent
Gao

(10) Patent No.: US 12,108,566 B2
(45) Date of Patent: Oct. 1, 2024

(54) SERVER MEMORY ARRAY COOLING HARDWARE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 281 days.

(21) Appl. No.: 17/699,743

(22) Filed: Mar. 21, 2022

(65) Prior Publication Data
US 2023/0301022 A1    Sep. 21, 2023

(51) Int. Cl.
*H05K 7/20*    (2006.01)
*H05K 7/14*    (2006.01)

(52) U.S. Cl.
CPC ....... *H05K 7/20281* (2013.01); *H05K 7/1427* (2013.01)

(58) Field of Classification Search
CPC ...... G06F 1/20; G06F 2200/201; G06F 1/184; G06F 1/185; H01L 23/473; H01L 23/4093; H01L 23/427; H01L 23/367; H01L 2224/33181; H01L 23/42; H05K 7/20772; H05K 7/20254; H05K 7/20509; H05K 2201/10159; H05K 1/0203; H05K 1/14; H05K 7/20336; H05K 7/2049; F28F 1/20; F28F 2275/085; F28F 2275/08

USPC ......................................................... 361/699
See application file for complete search history.

(56) References Cited

U.S. PATENT DOCUMENTS

| | | | | |
|---|---|---|---|---|
| 8,570,744 B2* | 10/2013 | Rau | ...................... | H01L 23/473 |
| | | | | 361/720 |
| 9,158,348 B2* | 10/2015 | Berk | ......................... | G06F 1/20 |
| 9,497,888 B2* | 11/2016 | Arvelo | .................... | F16L 41/10 |
| 2008/0259567 A1* | 10/2008 | Campbell | ............. | H01L 23/473 |
| | | | | 257/E23.098 |
| 2011/0286175 A1* | 11/2011 | Iyengar | ..................... | G06F 1/20 |
| | | | | 361/679.47 |
| 2012/0026670 A1* | 2/2012 | Rau | .......................... | G06F 1/20 |
| | | | | 361/679.31 |
| 2018/0063998 A1* | 3/2018 | Aoki | ....................... | G06F 1/203 |
| 2022/0003511 A1* | 1/2022 | Embleton | ................ | B32B 3/30 |
| 2024/0145333 A1* | 5/2024 | Luo | .................... | H05K 7/20772 |

* cited by examiner

*Primary Examiner* — Mandeep S Buttar
(74) *Attorney, Agent, or Firm* — WOMBLE BOND DICKINSON (US) LLP

(57) ABSTRACT

Hardware for cooling server memory arrays. In one embodiment, a server motherboard is provided on which a packaged data processing unit is mounted and electrically connected to metal traces formed thereon. Memory slots are also mounted on the server motherboard and electrically connected to metal traces formed thereon. Memory modules are received in the memory slots, respectively. A plurality of cooling devices are thermally connected to the plurality of memory modules, respectively. The plurality of the cooling devices are assembled in a cooling apparatus, which provides structural and thermal function for the cooling devices.

8 Claims, 12 Drawing Sheets

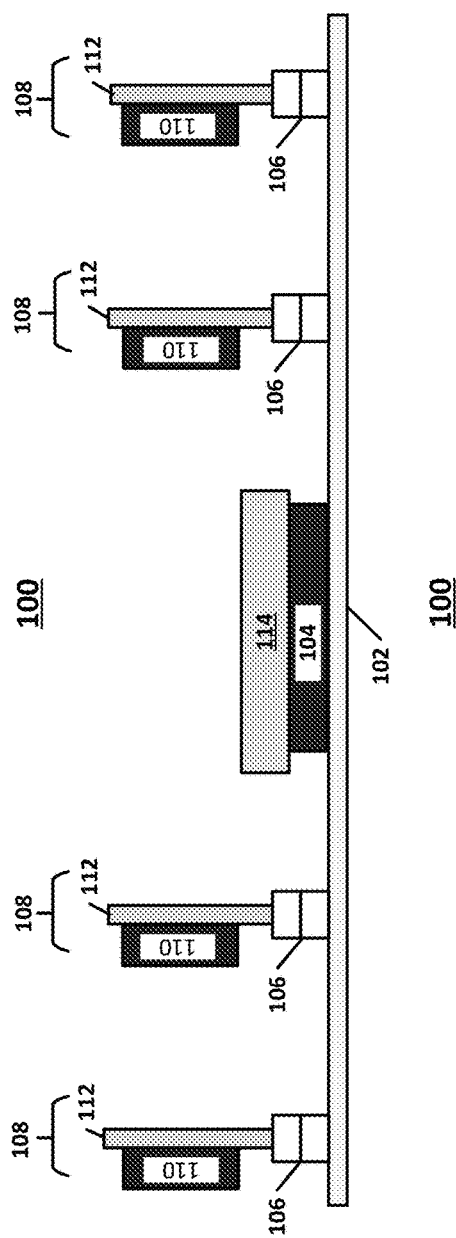

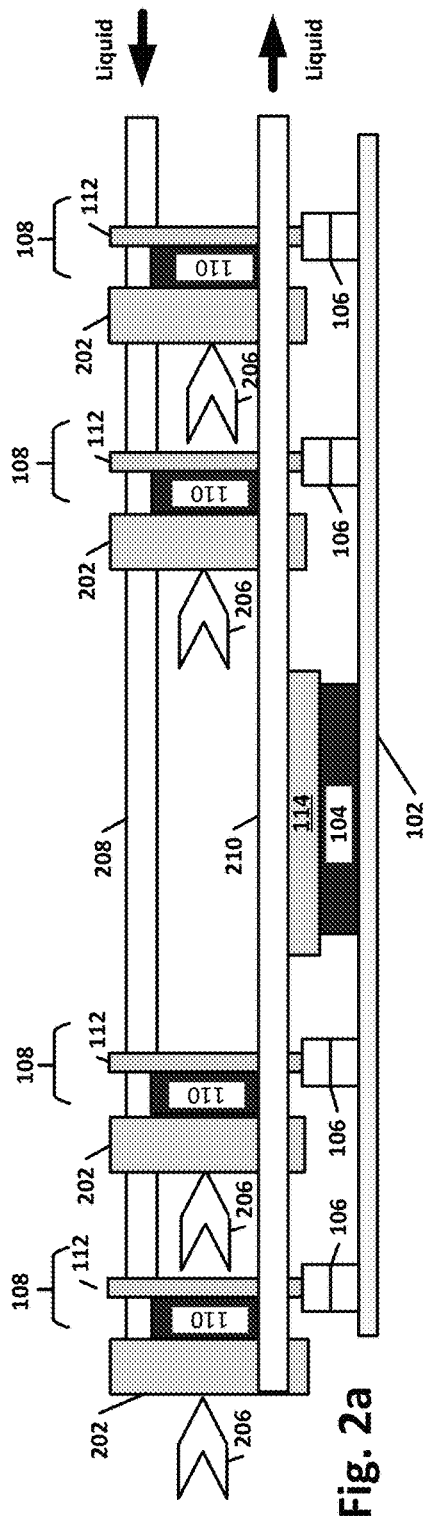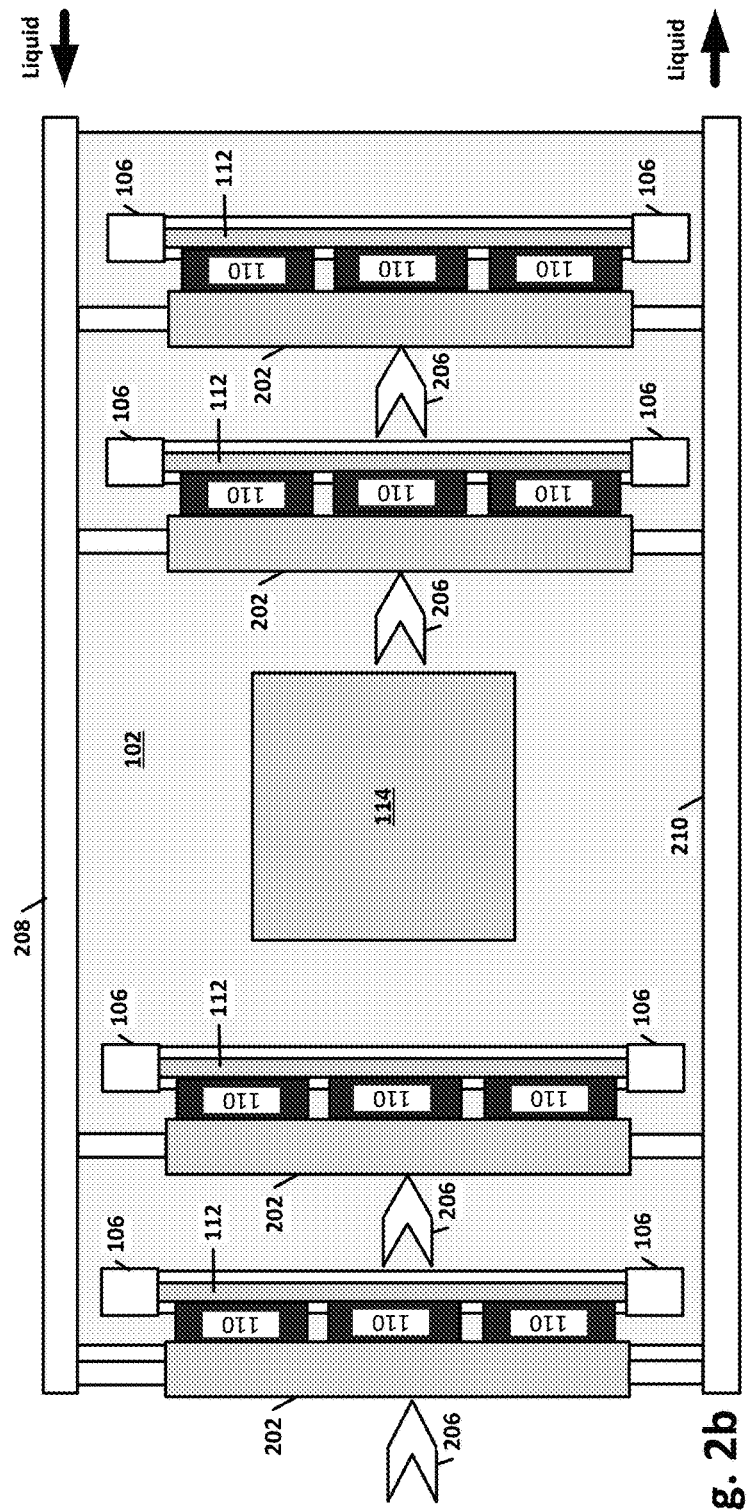
Fig. 2a
Fig. 2b

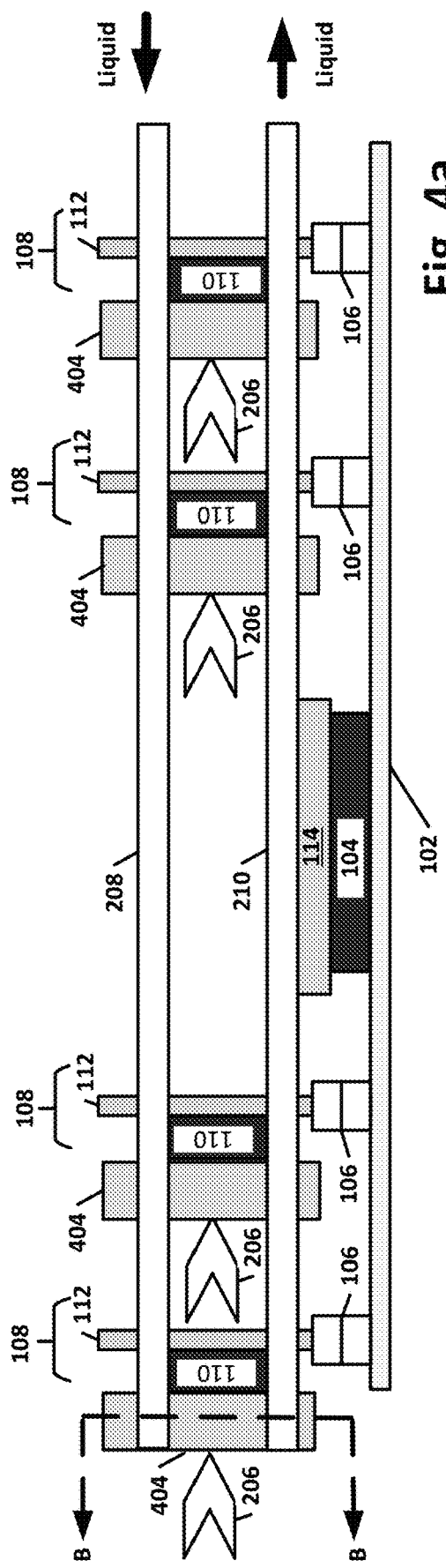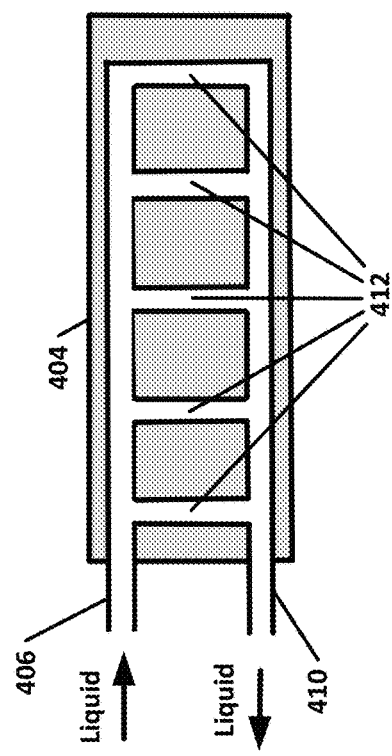

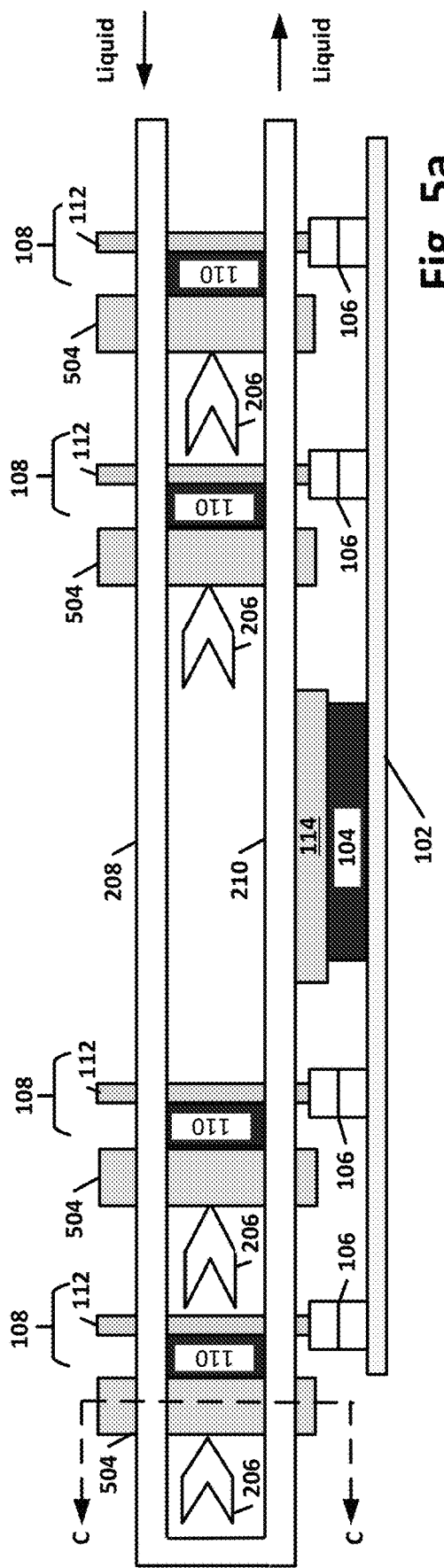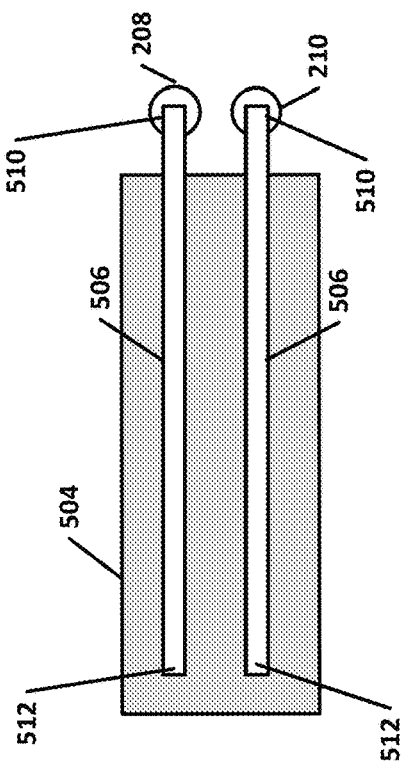

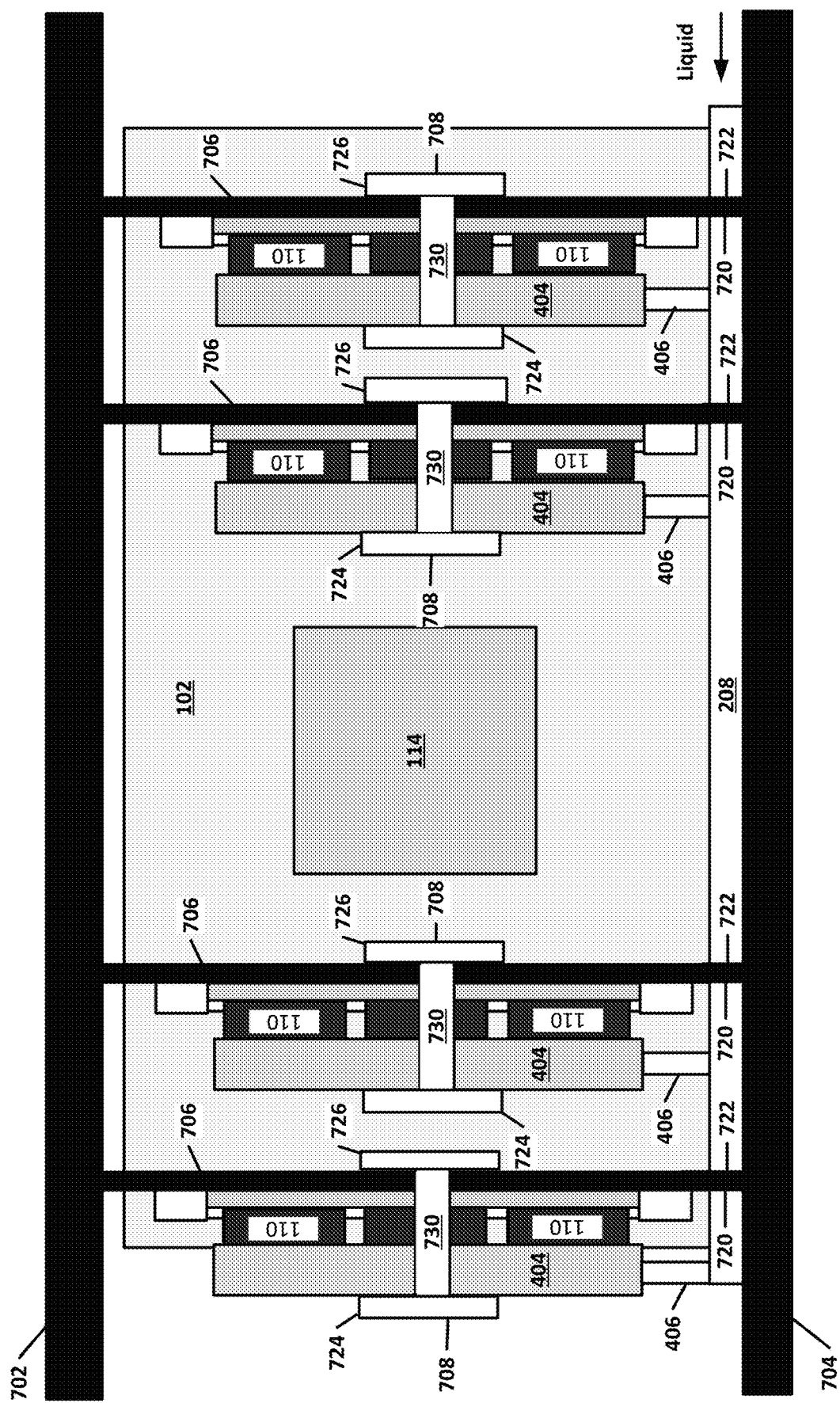

SERVER MEMORY ARRAY COOLING HARDWARE

FIELD OF THE INVENTION

Embodiments of the present disclosure relate generally to server cooling. More particularly, embodiments of the present disclosure relate to hardware for cooling server memory arrays. The present disclosure will be made with respect to cooling server memory arrays it being understood the present disclosure should not be limited.

BACKGROUND

A server is a computer that provides a service to another computer and its user, also known as the client. Key components of a server include the motherboard upon which are mounted electronic components such as one or more central processing units (CPUs), and memory.

Electronic components in servers generate heat during operation. The number and performance of electronics components such as CPUs and memory has steadily increased, thereby increasing the amount of heat generated during operation. The reliability of servers in general, and their electronic components in particular, decreases if the environment in which they operate increases in temperature. Maintaining a cool environment is critical for normal operations of servers. More effective and efficient cooling solutions are required as the performance of servers increase.

BRIEF DESCRIPTION OF THE DRAWINGS

The present disclosure is illustrated by way of example, and not by way of limitation, in the figures of the accompanying drawings in which like reference numerals refer to similar elements and in which:

FIG. 1a is a diagram illustrating relevant components of a server motherboard when viewed from the side.

FIG. 1b is a diagram illustrating the server motherboard of FIG. 1a when viewed from above.

FIG. 2a is a diagram illustrating the server motherboard of FIGS. 1a and 1b, and a memory-array cooling hardware assembly employing one embodiment of the present disclosure when viewed from the side.

FIG. 2b is a diagram illustrating the server motherboard and memory-array cooling hardware assembly of FIG. 2a when viewed from above.

FIG. 3a is a diagram illustrating an example cooling device that can be employed in the memory-array cooling hardware assembly of FIG. 2a.

FIG. 3b is cross sectional view of the cooling device shown in FIG. 3a.

FIG. 4a is a diagram illustrating an example cooling device that could be employed in the memory-array cooling hardware assembly of FIG. 2a.

FIG. 4b is cross sectional view of the cooling device shown in FIG. 4a.

FIG. 5a is a diagram illustrating an example cooling device that could be employed in the memory-array cooling hardware assembly of FIG. 2a.

FIG. 5b is cross sectional view of the cooling device shown in FIG. 5a.

FIG. 6a is a diagram illustrating an example cooling device that could be employed in the memory-array cooling hardware assembly of FIG. 2a.

FIG. 6b is cross sectional view of the cooling device shown in FIG. 6a.

FIG. 7 is a diagram of the memory-array cooling hardware assembly in FIG. 2a according to a first embodiment of the present disclosure.

DETAILED DESCRIPTION

Figure 3A:
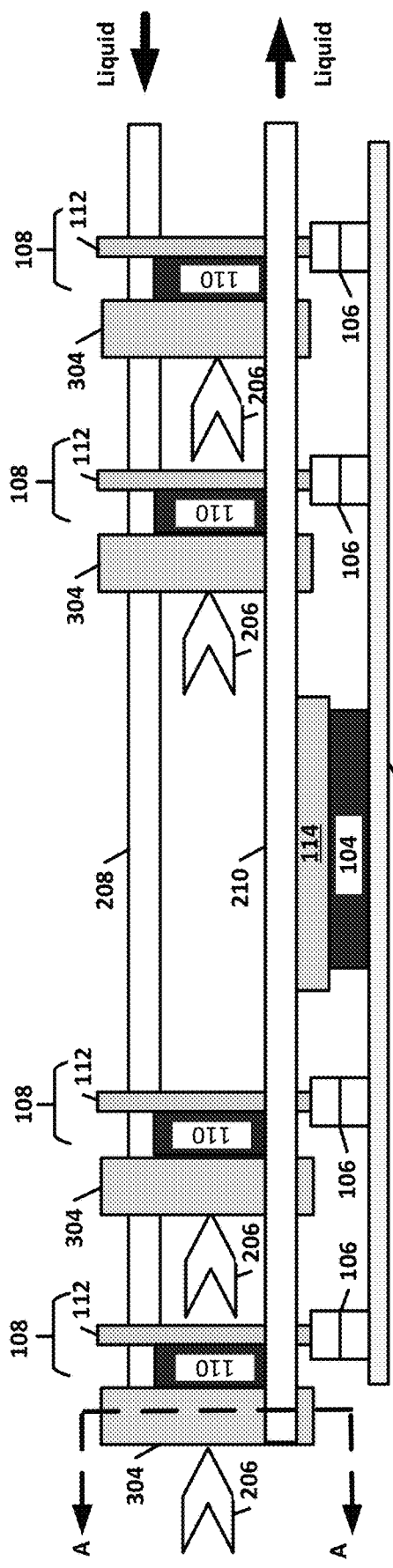

Server motherboards provide a central nexus through which electronic components communicate. FIGS. 1a and 1b illustrate side and top views, respectively, of an example server motherboard 100. Figures in this disclosure illustrate relevant components of a server motherboard. In other words, "server motherboard" should not be limited to that shown in the figures. Server motherboards may contain fewer or more components than that shown in figures of this disclosure.

Server motherboard 100 can be contained inside a server chassis (not shown). The server chassis can be inserted into an array of server slots (e.g., standard shelves) respectively of a server rack.

Server motherboard 100 includes a printed circuit board (PCB) 102 upon which components including packaged CPU 104, and memory slots 106 are mounted. Memory slots 106 are mechanical devices that receive memory modules 108. Each memory module 108 includes an array of packaged memory (e.g., random access memory or RAM) devices 110 mounted on a PCB 112.

PCBs have flat conductive wires or traces that can be etched from one or more thin sheet layers of metal laminated onto and/or between sheet layers of a non-conductive substrate. Metal vias extending through non-conductive substrate layers, can electrically connect traces at different levels. PCB traces carry signals (e.g., data signals, address signals, etc.) between components such as packaged CPU 104 and packaged memory devices 110.

Packaged devices such as packaged CPU 104 and packaged memory devices 110 have cases that isolate and/or protect internal integrated circuits. Cases can be made of solid glass, plastic, ceramic, etc. For the purposes of explanation only, cases are presumed to be made of plastic such as a mold compound (e.g., epoxy resin). Modern mold compounds have evolved into complex formulations that contain many raw materials. Fillers such as alumina can be added to increase a mold compound's thermal conductivity, which in turn may help cool encased integrated circuits such as a RAM or CPUs, while maintaining electrical isolation. Cases can be formed using any one of many different types of packaging techniques including transfer molding.

Packaged devices such as packaged CPU 104 and packaged memory devices 110 include connectors (e.g., leads) that can be attached (e.g., soldered) to traces on a PCB. Connectors provide electrical connection between components (e.g. a CPU or RAM) and traces of a PCB such as PCB 102 or PCB 112. Packaged CPU 104 includes connectors that are attached traces (not shown) of PCB 102. Packaged memory devices 110 include connectors that are attached to traces (not shown) of respective PCBs 112.

Memory slots 106 allow memory modules 108 to be inserted into server motherboard 100. FIGS. 1a and 1b show four memory slots 106 that are mounted on PCB 102, it being understood that server mother boards may contain fewer or more than four memory slots. Clasps hold memory modules 108 in slots 106. Claps can be released so that memory modules 108 can be swapped for new ones.

Memory modules 108 are received in memory slots 106, respectively. Each memory module 108 includes an array of three packaged memory devices 110 mounted on a PCB 112, it being understood that memory modules may contain fewer or more than three packaged memory devices 110. Traces on PCB 112 connect memory modules 108 to connectors (not shown) on PCB 112. These traces conduct signals and/or supply voltages between memory modules 108 and devices (e.g., packaged CPU 104) external to memory modules 108. Connectors of PCB 112 are electrically connected to respective connectors of memory slots 106, which in turn are coupled to respective traces on server PCB 102.

Packaged CPU 104 generates substantial heat during operation and should be cooled to prevent overheating. Packaged CPU 104 can be cooled by cooling device 114. Cooling devices transfer heat away from a thermally connected device such as a packaged CPU, GPU, ASIC, SoS, etc.

A cooling device may include internal micro channels through which cooling liquid can flow. Cooling liquid enters the cooling device, absorbs heat as it travels through the micro channels, and exits the cooling device. In another version a cooling device may include embedded tubes. Cooling liquid enters the cooling device at one end of an embedded tube, absorbs heat as it travels through the tube, and exits the cooling device at the other end of the tube. Still other types of cooling devices use heat pipes. A heat pipe is a heat-transfer device that employs phase transition. A typical heat pipe consists of a sealed pipe made of a material that is compatible with a working liquid such as copper for water heat pipes, or aluminum for ammonia heat pipes. The heat pipe is partially filled with the working liquid and then sealed. The working liquid is chosen so that the heat pipe contains both vapor and liquid over the operating temperature range. Each heat pipe extends between an evaporator end, and a condenser end. The evaporator end section is embedded in the cooling device. Heat is transmitted to the evaporator end section. The heat vaporizes the liquid at the evaporator end, and it travels up the heat tube to the condenser end, which is external to the cooling device. At the condenser end, heat of the vapor exits the heat tube, and the vapor condenses back to liquid and is absorbed into a wick. The condensed liquid falls back through the wick to the evaporator end, and the cycle continues. The most common liquids used in heat pipes include water, ammonia, acetone and methanol. In moderate temperature range, water is the ideal working liquid due to its high latent heat and boiling point. For low temperature applications, ammonia, acetone and methanol may be a better option. The performance of heat pipe is mainly determined by its wick, which performs several primary functions: First, to allow the backflow of the liquid from the condenser end to the evaporator end; Second, to allow the heat transfer to the liquid; Third, to provide room for the liquid to change phase. Heat pipes are made with different types of wick structures including; a sintered wick, a grooved wick and a screen mesh wick. The sintered wick allows high heat flux and wide working angle. The grooved wick offers light weight and low cost, but its working angle is limited and often gravity dependent. The screen mesh wick combines the features of both sintered and grooved wicks and is preferable in some applications.

FIGS. 1a and 1b show a CPU cooling device 114 in thermal contact with the case of packaged CPU 104. Cooling device 114 cools packaged CPU 104. Heat is transferred from the packaged CPU 104 to cooling device 114 via the plastic case of packaged CPU 104. No cooling devices are provided for cooling packaged memory devices 110. The present disclosure contemplates cooling devices for cooling packaged memory devices 110 to reduce the temperature at which they operate.

FIGS. 2a and 2b show side and top views of server motherboard 100 and a memory-array cooling hardware assembly employing one embodiment of the present disclosure. Memory-array cooling hardware assembly includes cooling devices 202 that are in thermal contact with packaged memory devices 110. More particularly, cooling devices 202 are in thermal contact with case surfaces of respective packaged memory devices 110. As will be more fully described below, cooling devices 202 are in fluid communication with a liquid cooling loop. In one embodiment, this loop includes a supply line 208 and a return line 210 through which cooling liquid can flow. Supply line 208 and return line 210 are in fluid communication with a pump and heat exchanger (not shown).

The memory-array cooling hardware assembly may include press-fit structures 206 that press cooling devices 202 against packaged memory devices 110. Press-fit structures 206 are symbolically shown within FIGS. 2a and 2b. The press-fit structures 206 can be positioned between a pair of frames, which are more fully described below. The cooling liquid supply and return lines 208 and 210, respectively, can be supported by one or both of the pair of frames, as will also be more fully described below.

Press-fit structures 206 press substantially flat surfaces of cooling devices 202 against substantially flat case surfaces of packaged memory devices 110, respectively, to ensure thermal conduction of heat therebetween. Surfaces of cooling devices 202 and packaged memory devices 110 that contact each other, should be smooth to enhance heat transfer therebetween.

As will be more fully described below press-fit structures 206 can take any one of many different forms. In most embodiments press-fit structures 206 are configured for releasable connection to packaged memory devices 110. When a press-fit structure 206 is released, the old memory module on which packaged memory devices 110 reside, can be removed from its slot 106 and replaced with a new memory module.

Figure 3B:
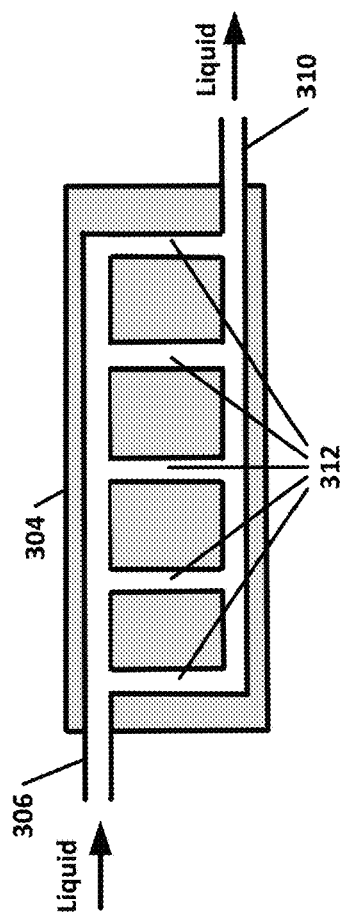

Cooling devices 202 can take any one of many different forms. Cooling devices can be liquid cooled, air cooled, or cooled using heat pipes. Other types of cooling devices are contemplated. FIGS. 3a and 3b illustrate top and cross-sectional views, respectively, of cooling devices that employ micro channels through which a cooling liquid can flow. The cross-sectional view in FIG. 3b is taken along line A-A shown in FIG. 3a. In this embodiment each cooling device includes a metal cooling plate 304 having a cooling liquid input port 306 mechanically connected and in fluid communication with cooling liquid supply line 208, and a cooling liquid output port 310 mechanically connected to and in fluid communication with a cooling liquid return line 210.

The ports are positioned on oppositely facing side surfaces of cooling plate 304 as shown. Metal cooling plate 304 has oppositely facing flat surfaces. One flat surface of metal cooling plate 304 is shown in thermal contact with flat case surfaces of respective packaged memory devices 110. Press-fit structure 206 applies a force to the other flat surface for maintaining the thermal contact between cooling plate 304 and packaged memory devices 110. Metal cooling plate 304 includes micro channels through which cooling liquid can flow. FIG. 3b shows micro channels 312 through which cooling liquid can flow between the input and output ports 306 and 310, respectively. A cooling liquid enters input port 306 from supply line 218, flows through the micro channels 312 of cooling plate 304 and exits via liquid output port 310 to return line 210. Heat from thermally connected memory modules 110 is conducted to the cooling liquid as it flows through micro channels. Heat is exchanged at the interfaces between the cooling liquid and the walls of the micro channels 312. FIG. 3b aims to provide a simplified representation of internal structure for fluid flowing stream. The actual microchannel structure can be in different.

FIGS. 4a and 4b illustrate top and cross-sectional views, respectively, of cooling devices that employ micro channels. The cross-sectional view is taken along line B-B shown in FIG. 4a. Cooling devices shown in FIGS. 3a and 4a are substantially similar. However, in contrast to the cooling device shown in FIG. 3a, the cooling device of FIG. 4a includes a metal cooling plate 404 with cooling liquid input port 406 and cooling liquid output port 410 positioned on the same side surface as shown. Metal cooling plate 404 has oppositely facing flat surfaces. One flat surface of metal cooling plate 404 is in thermal contact with flat case surfaces of respective packaged memory devices 110. Press-fit structure 206 applies a force to the other flat surface for maintaining the thermal connection between the cooling plate 404 and packaged memory devices 110. Metal cooling plate 404 includes micro channels 412 through which cooling liquid can flow. A cooling liquid enters input port 406 from supply line 208, flows through the micro channels 412 of cooling plate 404 and exits via liquid output port 410 to return line 210. Heat from thermally contacted memory modules 110 is conducted to the cooling liquid as it flows through micro channels. Heat is exchanged at the interfaces between the cooling liquid and the walls of the micro channels 412.

FIGS. 5a and 5b illustrate top and cross-sectional views, respectively, of cooling devices that employ heat pipes. In this embodiment the cooling device includes a metal cooling plate 504 with embedded heat pipes 506. FIGS. 5a and 5b show two heat pipes 506, it being understood that fewer or more heat pipes can be employed. Evaporator ends 512 are contained inside cooling plate 504, while condenser ends 510 are external to cooling plate 504 and extend into supply line 208 or return line 210 where heart is exchanged, and vapor in the heat pipes 506 is condensed back into liquid. Rather than using supply line 208 or return line 210, the condenser ends 510 are thermally attached to metal fins (not shown) in an alternative embodiment. Returning back to FIGS. 5a and 5b, metal cooling plate 504 has oppositely facing flat surfaces. One flat surface of metal cooling plate 504 is shown in thermal contact with flat case surfaces of respective packaged memory devices 110. Press-fit structure 206 applies a force to the other flat surface for maintaining the thermal connection between the cooling plate 504 and packaged memory devices 110. Heat is transmitted from a thermally connected packaged memory device 110 to evaporator end 510. The heat vaporizes the liquid at the evaporator end, and it travels up the heat tube to the condenser end 512. At the condenser end 512, heat of the vapor is exchanged with cooling liquid in the supply line 208, the vapor condenses back to liquid, and is absorbed into a wick 514. The condensed liquid falls back through the wick 514 to the evaporator end 510, and the cycle continues.

Figure 6A:
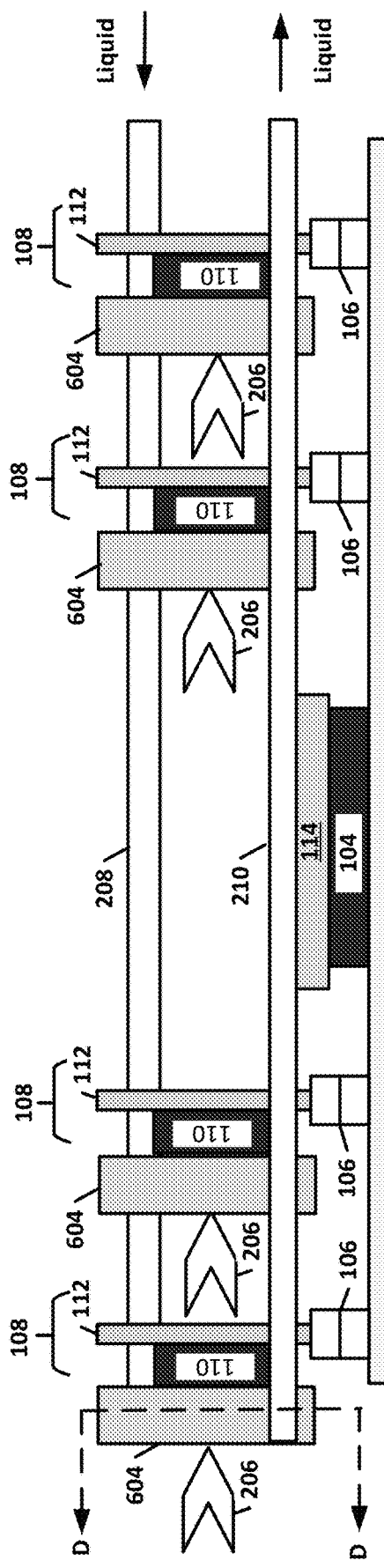
Figure 6B:
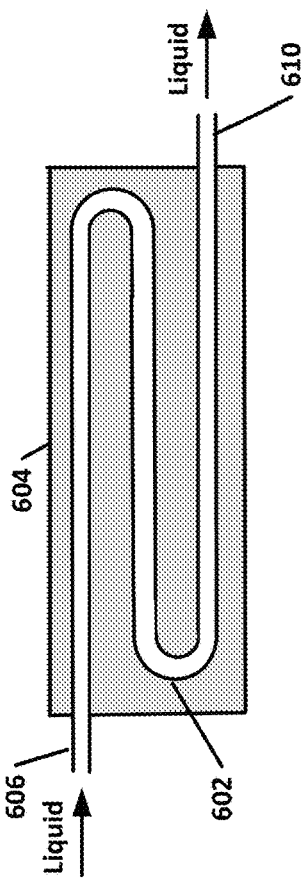

FIGS. 6a and 6b illustrate top and cross-sectional views, respectively, of cooling devices that employ cooling tube 602. FIGS. 6a and 6b show one tube, it being understood that fewer or more tubes can be employed. In this embodiment the cooling device includes a metal cooling plate 604 having a cooling liquid input port 606 in fluid communication with cooling supply line 208, and a cooling liquid output port 610 in fluid communication with cooling return line 210. The ports are positioned on oppositely facing side surfaces as shown. A cooling liquid enters input port 606 from supply line 208, flows through the tube 602 and exits via liquid output port 610 to return line 210. Heat from thermally contacted memory modules 110 is conducted to the cooling liquid as it flows through tube 602. Heat is exchanged at the interfaces between the cooling liquid and the walls of the tube 602. Metal cooling plate 604 has oppositely facing flat surfaces. One flat surface of metal cooling plate 604 is shown in thermal contact with flat case surfaces of respective packaged memory devices 110. Press-fit structure 206 applies a force to the other flat surface for maintaining the thermal connection between the cooling plate 604 and packaged memory devices 110. Other types of cooling devices besides the ones shown in FIG. 4b, 5b, 6b may also compatible with the proposed memory-array cooling hardware assembly of FIGS. 2a and 2b.

With continuing reference to FIGS. 2a and 2b, FIG. 7 illustrates an example memory array cooling hardware assembly when seen from the top, which includes example press-fit structures 206 that are rigidly connected between example upper and lower frames 702 and 704, respectively. Each press-fit structure 206 in this embodiment includes a supporting plate 706 and a pressure clamp 708. The cooling devices in this embodiment take form in the cooling plates 404 shown in FIGS. 4a and 4b, which include micro channels 412. Input and output ports 406 and 410, respectively, of cooling plates 404 are mechanically connected to and in fluid communication with supply line 208 and return line 210, respectively, which in turn are attached to the lower frame 704. Supply line 210 is hidden beneath supply line 208 in the view of FIG. 7.

Cooling plates 404 and supporting plates 706 define spaces in which memory modules 108 can be positioned. Memory module spaces can be vertically aligned with respective memory slots 106 on PCB 102. With memory modules 208 received in the memory slots 106, cooling plates 404 and supporting plates 706 can be connected together by pressure clamps 708 with memory modules 108 therebetween. Each support plate 706 has oppositely facing flat surfaces 720 and 722. Surfaces 720 are substantially flat and configured to engage PCBs 112 of respective memory modules 108. In one embodiment, pressure clamps 708 include end sections 724 and 726 connected together by a middle section 730. End sections 724 and 726 can engage flat surfaces of cooling plates 404 and supporting plates 706. Pressure clamps 708 can maintain the thermal contact between cooling plates 404 and packaged memory devices 110. A pressure clamp 708 can be detached from a cooling plate 404 and supporting plate 706 to enable replacement of a memory module 108.

Figure 8:
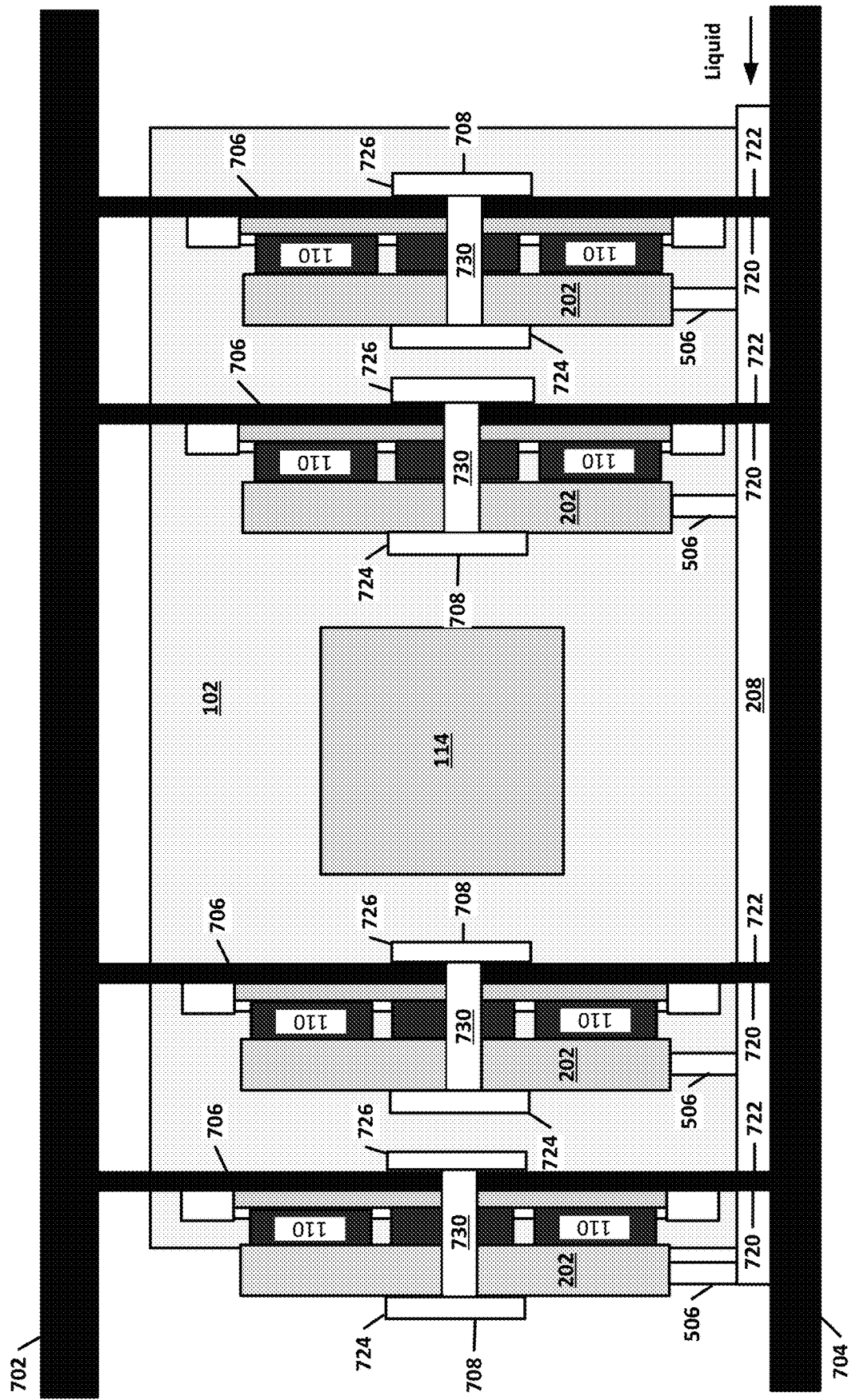
FIG. 8 is a diagram of the memory-array cooling hardware assembly in FIG. 2a according to a second embodiment of the present disclosure.

FIG. 8 illustrates the hardware assembly shown within FIG. 7, but with cooling plates 404 of FIGS. 4a and 4b replaced by cooling plates 504 of FIGS. 5a and 5b, which include heat pipes 506. Like the structures shown within FIG. 7, each press-fit structure 206 shown within FIG. 8 includes a supporting plate 706 and a pressure clamp 708. Heat pipes 506 extend from cooling plate 504. Condensing ends 510 of heat pipes 506 are positioned inside the supply line 208 or return line 210 and in thermal contact with the cooling fluid flowing through. Supply line 208 is mechanically attached to the lower frame 704. The return line 210 is also attached to the lower frame 704 and positioned below the supply line, but not visible in FIG. 8. Thermal contact between cooling plates 504 and memory devices 110 can be maintained when pressure clamps 708 connect cooling plates 504 and supporting plates 706. Each pressure clamp 708 can be detached from the cooling plate 504 and supporting plate 706 to enable replacement of memory module 108.

Figure 9:
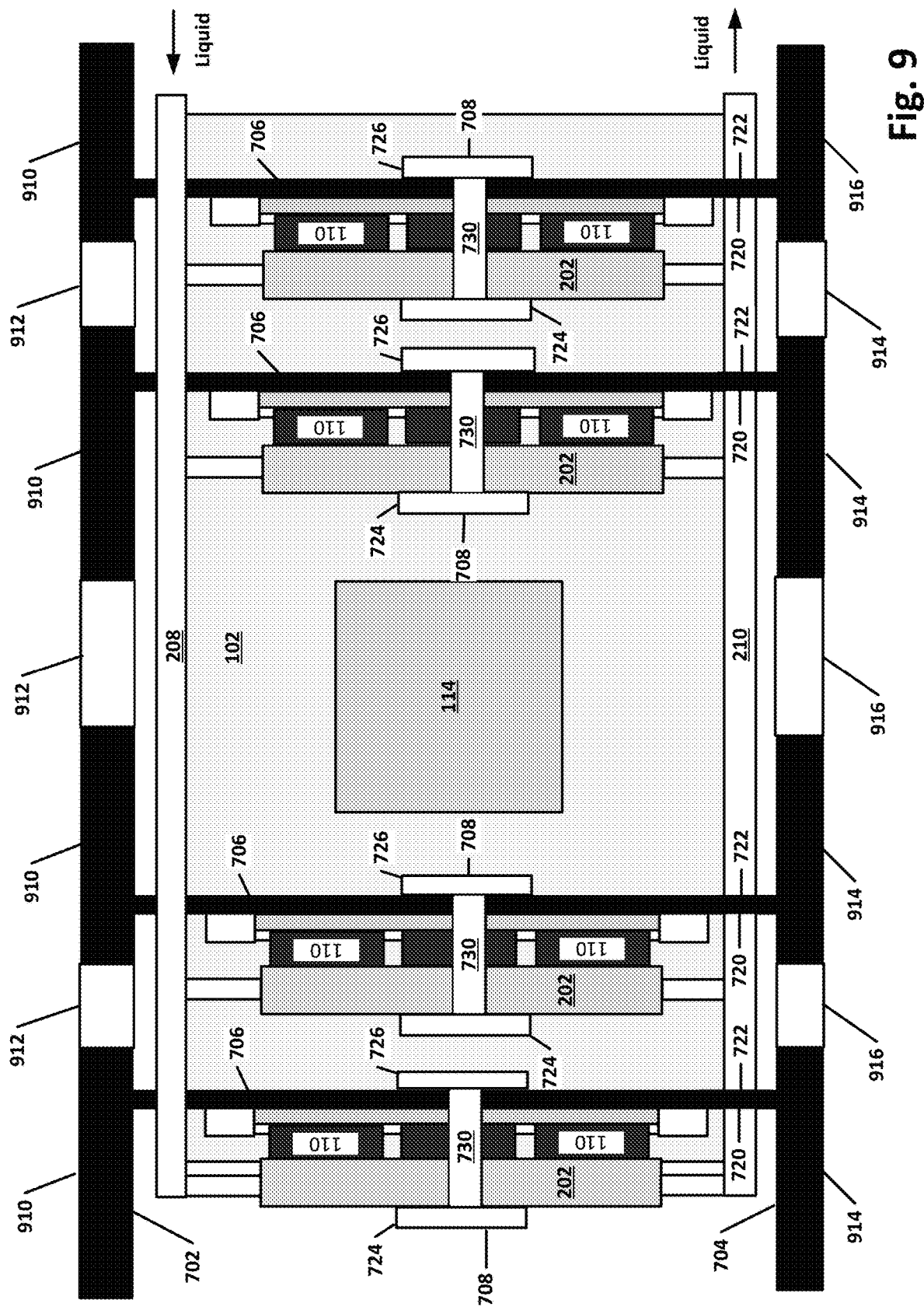
FIG. 9 is a diagram of the memory-array cooling hardware assembly in FIG. 2a according to a third embodiment of the present disclosure.

With continuing reference to FIGS. 7 and 8, upper frame 702 and lower frame 704 may be segmented with rigid portions connected together by elastic portions. FIG. 9 illustrate example segmented frames 702 and 704. Segmented frame 702 includes a plurality of laterally extending rigid portions 910 that are connected together by elastic portions 912. Segmented frame 704 includes a plurality of laterally extending rigid portions 914 that are connected together by elastic portions 916. Each elastic portion can be stretched or compressed. When stretched or compressed an elastic portion stores potential energy. When the force is removed, the potential energy is released and the elastic portion returns to its uncompressed or upstretched state. Thus, each elastic structure 912 and 914 has the ability to resist a distorting influence and return to its original size and shape when that influence or force is removed. Memory modules 108 may be damaged if too much pressure is applied to them by the press-fit structures 206. On the other hand, too little pressure may result in a poor thermal connection between cooling devices 202 and packaged memory devices 110. The elastic portions 912 and 916 ensure that proper loading pressure is applied to the memory modules 108. In one embodiment each elastic portion may take form in a metal spring.

Figure 10:
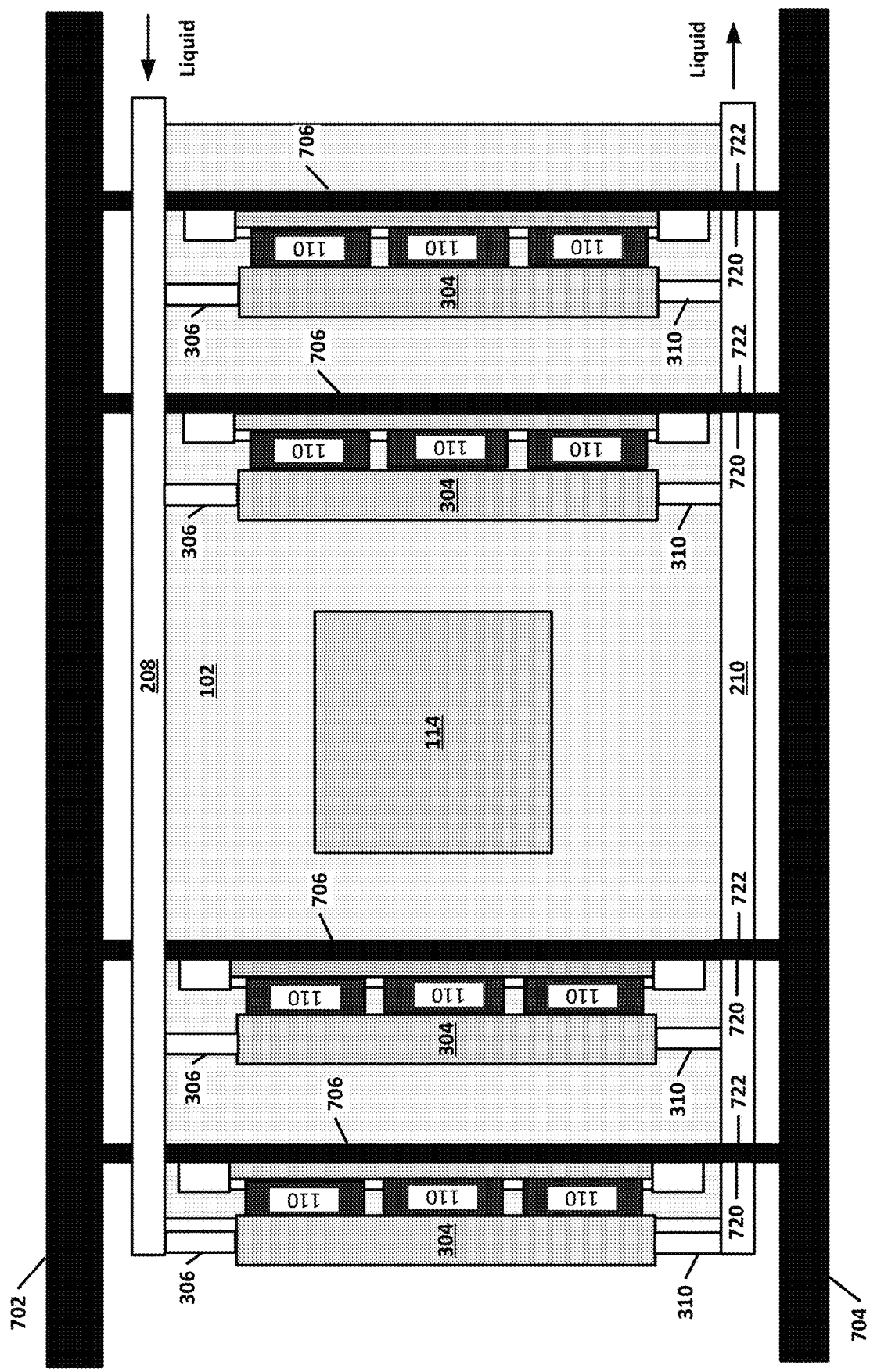
FIG. 10 is a diagram of the memory-array cooling hardware assembly in FIG. 2a according to fourth embodiment of the present disclosure.

Upper frame 702 and lower frame 704 in FIG. 9 are segmented with rigid portions connected by elastic portions. In an alternative embodiment, upper frame 702 and lower frame 704 may be solid or rigid structures that lack elastic portions. FIG. 10 illustrates an embodiment in which press-fit structures 206 include supporting plates 706 that are mechanically connected between solid upper frame 702 and solid lower frame 704. In this embodiment press-fit structures 206 include supporting plates 706, but lack pressure clamps 708. Cooling plates 304 shown in FIGS. 3a and 3b are employed in this embodiment. Cooling plates 304 are in fluid communication between supply line 208 and return line 210. The hardware assembly, including supporting plates 706 connected between solid frames 702 and 704, is capable of linear movement with respect to the supply line 208 and return lines 210. Cooling plates 304 can be positioned adjacent packaged memory devices 110 of respective memory modules 108. Then solid frames 702 and 704 along with their connected support plates 706, can be moved laterally until supporting plates 706 engage PCBs 112 of respective memory modules 108. Solid frames 702 and 704 can be locked in place to provide the pressure needed to press packaged memory devices 110 against surfaces of respective cooling plates 304.

Figure 11:
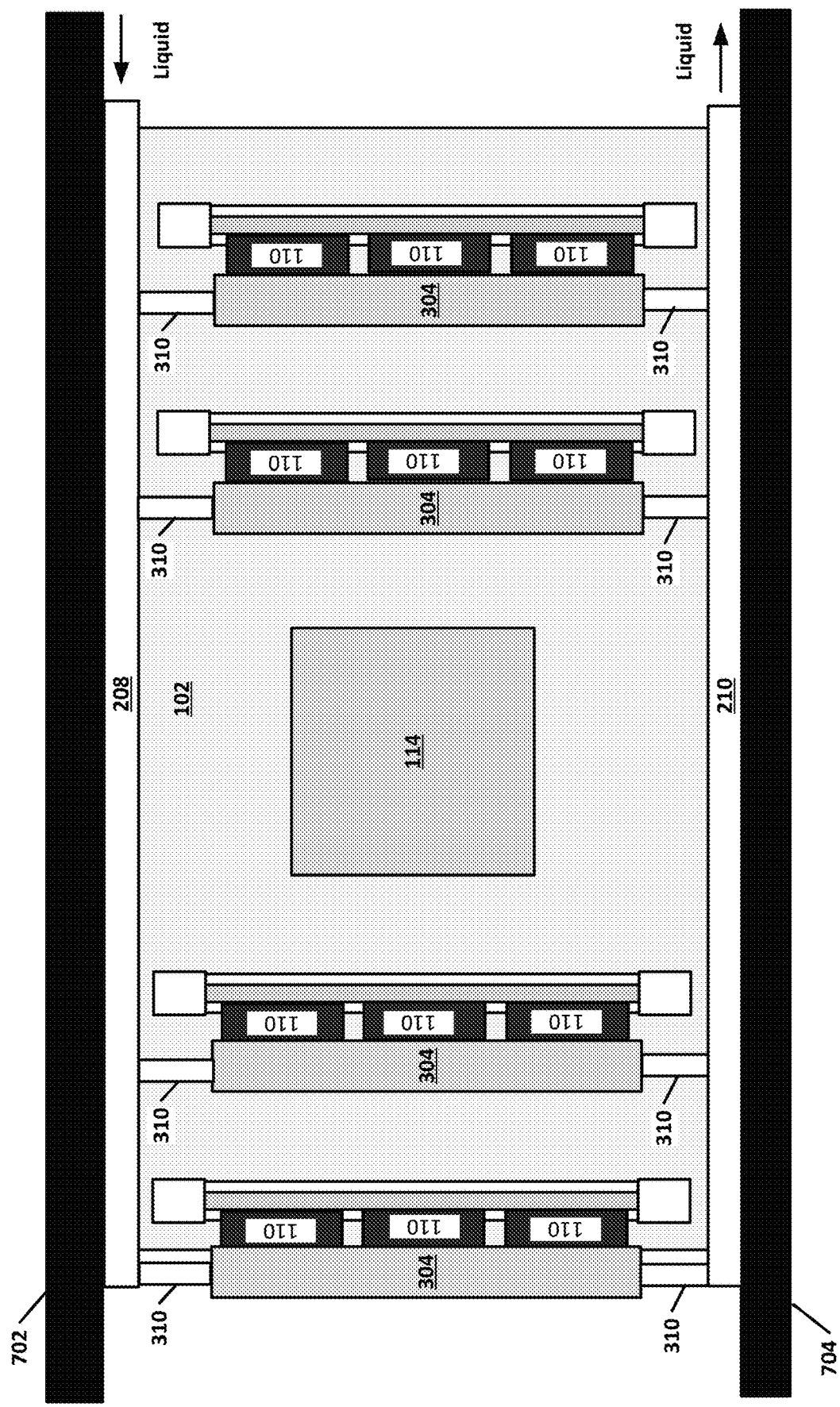
FIG. 11 is a diagram of the memory-array cooling hardware assembly in FIG. 2a according to fifth embodiment of the present disclosure.

FIG. 11 shows another hardware assembly embodiment in which the supply line 208 and the return line 210 are attached to solid upper frame 702 and solid lower frame 704, respectively. Cooling plates 304 of FIGS. 3a and 3b are employed in this embodiment. The cooling plates 304 are coupled to and in fluid communication supply line 208 and return line 210. The hardware assembly, including frames 702 and 704, and lines 210 and 218, are capable of linear movement since they are attached to each other. In this embodiment, ends of supply line 208 and the return line 210 are connected to flexible hoses (not shown) so that supply line 208 and return line 210 can move with solid frames 702 and 704. Frames 704 and 706, and lines 210 and 218 can be moved laterally together until cooling plates 304 engage memory devices 110 of memory modules 108. The hardware assembly provides the pressure needed to press packaged memory devices 110 against surfaces of respective cooling plates 304. Press-fit structures 206 are lacking in this embodiment.

Figure 12:
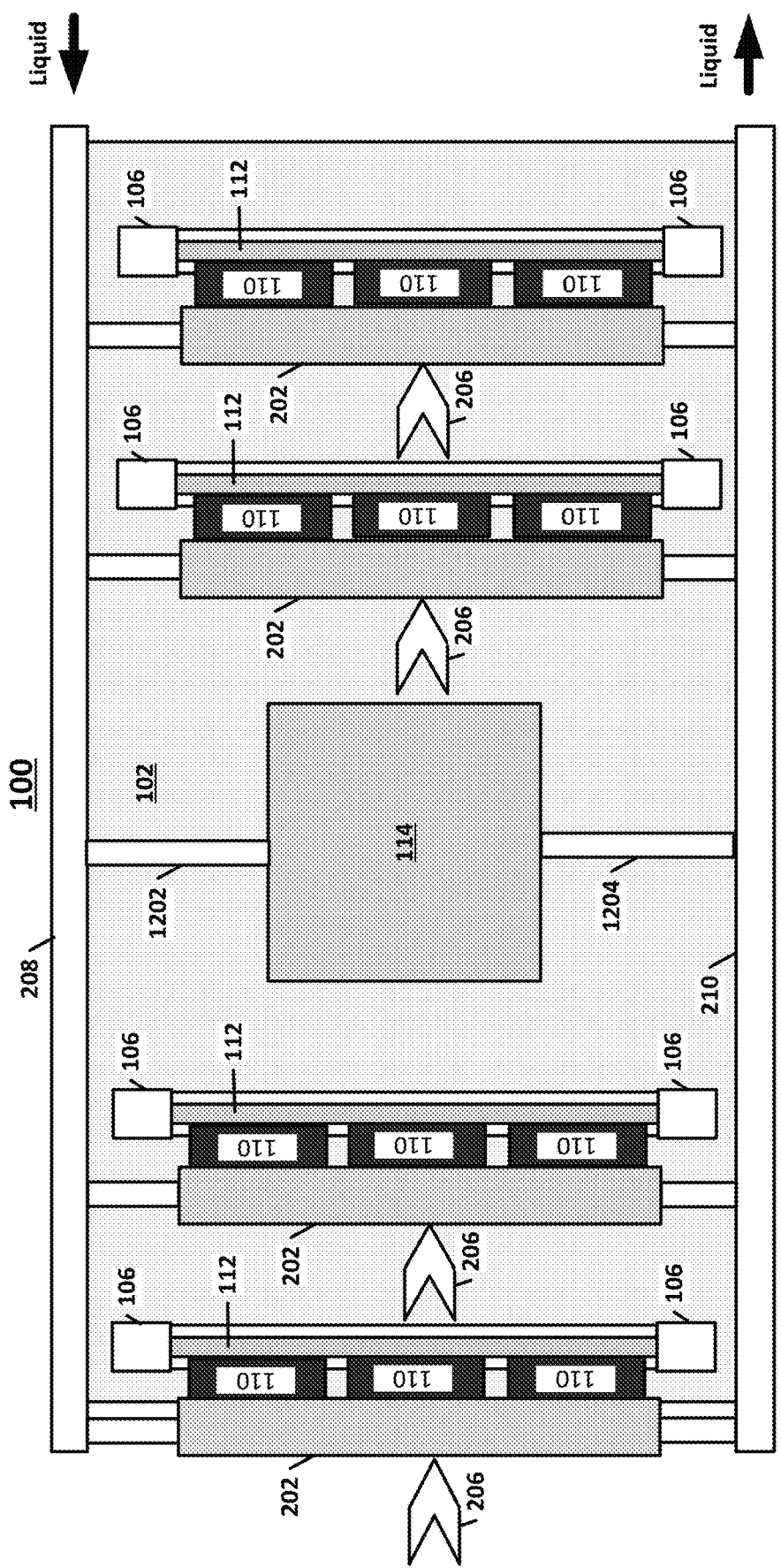
FIG. 12 is a diagram of a server motherboard, and a memory-array cooling hardware assembly employing another embodiment of the present disclosure when viewed from the top.

The memory-array cooling hardware assembly shown in FIGS. 2a and 2b show only cooling devices 202 in fluid communication with supply and return lines 208 and 210, respectively. In an alternative embodiment shown in FIG. 12, cooling device 114 can also be in fluid communication with supply and return lines 208 and 210, respectively, through input and output ports 1202 and 1204, respectively, while cooling devices 202 are also in fluid communication with supply and return lines 208 and 210, respectively.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An apparatus comprising:
    a server motherboard and a plurality of memory slots mounted on the server motherboard;
    a plurality of memory modules received in the plurality of memory slots, respectively, wherein the plurality of memory modules comprise a plurality of memory module boards, respectively, upon which a plurality of packaged memory devices are mounted, respectively;
    first and second conduits through which fluid can flow;
    a plurality of metal cooling devices in fluid communication with the first and second conduits, wherein the plurality of metal cooling devices are configured for thermal connection with the plurality of packaged memory devices, respectively, connected to the server motherboard, wherein each of the plurality of metal cooling devices comprises a substantially flat surface engaging a substantially flat surface of a respective one of the plurality of packaged memory devices; and
    a plurality of press-fit structures releasably connected to the plurality of metal cooling devices, respectively, wherein the plurality of press-fit structures press the plurality of metal cooling devices, respectively, against the plurality of packaged memory devices, respectively;
    wherein the plurality of press-fit structures engage the plurality of memory module boards, respectively, and wherein the plurality of press-fit structures comprise a plurality of support plates, respectively, rigidly connected to a frame, wherein the plurality of support plates engage the plurality of memory module boards, respectively.

2. The apparatus of claim 1 wherein the plurality of press-fit structures comprise a plurality of clips, respectively, which are releasably connected to the plurality of metal cooling devices, respectively, and the plurality of support plates, respectively.

3. The apparatus of claim 2 wherein the first and second conduits are rigidly connected to frame.

4. The apparatus of claim 2 wherein the first and second conduits are configured for independent movement with respect to the frame.

5. The apparatus of claim 1 wherein each of the metal cooling devices comprises a metal cooling plate comprising a metal tube through which cooling fluid can flow.

6. The apparatus of claim 1 wherein each of the metal cooling devices comprises a metal cooling plate comprising channels through which cooling fluid can flow.

7. An apparatus comprising:
- first and second memory modules each comprising a plurality of memory devices, each memory device comprising a case with a substantially flat surface through which heat can be conducted;
- a first cooling device thermally connected to the substantially flat surfaces of the memory devices of the first memory module;
- a second cooling device thermally connected to the substantially flat surfaces of the memory devices of the second memory module;
- first and second press-fit structures releasably connected to the first and second cooling devices, respectively;
- wherein the first press-fit structure presses the first cooling device against the substantially flat surfaces of the memory devices of the first memory module and wherein the first press-fit structure comprises:
  - a frame,
  - a support plate rigidly connected to the frame,
  - a rigid clip configured for mechanical connection to the first cooling device and the support plate, and
  - an elastic member that is compressed when the rigid clip is mechanically connected to the first cooling device; and
- wherein the second press-fit structure is configured to press the second cooling device against the substantially flat surfaces of the memory devices of the second memory module.

8. The apparatus of claim 7 further comprising:
- a first liquid cooling supply line through which a cooling fluid can flow;
- a second liquid cooling supply line through which the cooling fluid can flow;
- wherein each of the first and second cooling devices is in fluid communication with the first and second liquid cooling supply lines.

* * * * *